United States Patent [19]

Ashtaputre et al.

[11] Patent Number: 5,072,402
[45] Date of Patent: Dec. 10, 1991

[54] ROUTING SYSTEM AND METHOD FOR INTEGRATED CIRCUITS

[75] Inventors: Sunil V. Ashtaputre, San Jose, Calif.; Rajiv C. Mody, Gujarat, India

[73] Assignee: VLSI Technology, Inc., San Jose, Calif.

[21] Appl. No.: 419,041

[22] Filed: Oct. 10, 1989

[51] Int. Cl.$^5$ .......................................... G06F 15/60
[52] U.S. Cl. .................................. 364/491; 364/490; 364/489; 364/488
[58] Field of Search ................. 364/488, 489, 490, 491

[56] References Cited

U.S. PATENT DOCUMENTS

| | | | |
|---|---|---|---|
| 4,577,276 | 3/1986 | Dunlop et al. | 364/491 |
| 4,613,941 | 9/1986 | Smith et al. | 364/490 |
| 4,636,965 | 1/1987 | Smith et al. | 364/491 |
| 4,910,680 | 3/1990 | Hiwatashi | 364/491 |

OTHER PUBLICATIONS

Wei-Ming Dai et al., "A New Routing Region Definition and Ordering Scheme Using L-Shaped Channels", IEEE Proceedings of ISCAS 85, pp. 29-30.
Chi-Ping Hsu, "A New Two-Dimensional Routing Algorithm", 19th Design Automation Conference, IEEE 1985, pp. 46-50.
T. Hiwatashi et al., "A Hierarchical Routing System for VLSIs Including Large Macros", IEEE 1986 Custom Integrated Circuits Conference, pp. 235-238.
J. Hudson et al., "Rectilinear Area Routing: A Channel Router Approach", IEEE 1985 CICC, pp. 468-471.
H. Sai et al., "An Automatic Routing System for General Cell VLSI Circuits", IEEE 1985 CICC, pp. 68-71.
H. Krohn, "An Over-Cell Gate Array Channel Router", IEEE 1983, 20th Design Automation Conference, pp. 665-670.
M. Terai et al., "A Routing Program Application to Various Chip Structures of Gate Arrays", Joho Shori Gakkai, Ronbunshi, vol. 25, No. 3, May 1984, pp. 357-364.
David Hsu et al., "The Chip Compiler, an Automated Standard Cell/Macrocell Physical Design Tool", IEEE 1987 CICC, pp. 488-491.
S. Kimura et al., "An Automatic Routing Scheme for General Cell LSI", IEEE Trans. on CAD, Oct. 1983, pp. 285-292.
Dai et al., "Routing Region Definition and Ordering Scheme for Building-Block Layout", IEEE Trans. CAD, vol. CAD-4, No. 3, Jul. 1985, pp. 189-197.
C. H. Ng, "A Gridless Variable-Width Channel Router for Macro Cell Design", Proc. 24th Design Automation Conf. 1987.

Primary Examiner—Parshotam S. Lall
Assistant Examiner—V. N. Trans
Attorney, Agent, or Firm—Flehr, Hohbach, Test, Albritton & Herbert

[57] ABSTRACT

A system and method for routing interconnections through the layout of an integrated circuit is used in conjunction with a sliceable circuit layout specification that specifies the regions of the layout occupied by circuit components, a specification of the locations of terminals in the layout, and a netlist specifying for each terminal the set of other terminals that are to be connected to it. The regions of the circuit layout not occupied by circuit components are called routing regions. The circuit layout is sequentially sliced, defining a series of rectangular channels, each of which divides a region of the circuit layout containing two or more circuit components into two circuit regions each having at least one circuit component. For each channel, if there are one or more neighboring indented routing regions, a special channel is defined for each such indentation. After the entire routing region is divided into channels and special channels, interconnections are routed through those channels and special channels. In particular, before routing interconnections through each channel, interconnections are routed through the corresponding special channels, if any. A data structure is defined for denoting the sequence in which the channels are defined, the region of the layout occupied by each channel, and for each channel, the region of said layout occupied by each corresponding special channel, if any. The order in which channels are routed corresponds to the sequence in which channels were defined, as denoted in the data structure.

8 Claims, 6 Drawing Sheets

ROUTING SYSTEM AND METHOD FOR INTEGRATED CIRCUITS

The present invention relates generally to computer automated design systems for designing integrated circuits and particularly to computer aided design methods and systems for routing connections between the components of an integrated circuit.

BACKGROUND OF THE INVENTION

The design and manufacture of application specific integrated circuits (ASICs) has become a significant segment of the semiconductor industry. The two primary methods of designing ASICs employ gate arrays and cell libraries. Gate array based circuits are integrated circuits with a predefined set of components at predefined positions on a semiconductor die. Specific applications are implemented by interconnecting the predefined components so as to perform a specified set of functions. Cell based circuits are integrated circuits that are formed using cells selected from one or more cell libraries. A cell library is a set of predefined components that can be placed at any specified position on a semiconductor die and then interconnected so as to perform a specified set of functions. While there are other technologies used for designing ASICs, the present invention is primarily concerned with automatically routing the interconnections between components in cell based or gate array based circuits.

To quickly and efficiently design cell based and array based circuits, it is important to be able to quickly and accurately form or route the connections between the components of a specified circuit To this end, there are number of automatic routing schemes which are used in prior art products, and which have been disclosed in prior art publications.

The present invention solves one particular problem associated with the prior art routing schemes. More specifically, the problem addressed by the present invention concerns routing interconnections through non-rectangular routing regions Looking at the circuit layout 180 shown in FIG. 5, it is standard procedure to divide the routing regions 190, 192 and 194 into two channels: one channel comprising regions 190 and 192, and a second channel comprising region 194. Due to standard limitations placed by prior art CAD systems on the positions that interconnections can cross the boundaries between channels, the connection between terminals 184 and 186 will typically have the shape of connection line 182. Clearly, connection line 182 is much longer than the shortest possible interconnection line between terminals 184 and 186.

The present invention provides a method of creating and routing "special channels" which results in shorter interconnection lines and improves the quality of the layout of integrated circuits.

SUMMARY OF THE INVENTION

In summary, the present invention is a method suitable for use in computer aided design systems, of routing interconnection lines between specified terminals in an integrated circuit. It is assumed that the circuit is "sliceable". The circuit is successively sliced into smaller circuit regions. For each slice, a rectangular routing region, called a channel, is formed. If the circuit regions on either side of the channel include an indentation, a special rectangular channel is formed which occupies each such indentation. This process of forming channels and special channels continues until all the routing regions between the circuit components have been processed. The resulting set of channels and special channels are represented by a data structure that is used to define the order in which interconnections are to be routed through those channels. In general, when routing interconnections so as to connect specified terminals of the circuit components, the channels are processed in an order corresponding to the order in which the circuit was sliced. Furthermore, in accordance with the present invention, before routing the interconnections through each regular rectangular channel, interconnections are first routed through the special channels, if any, corresponding to indentations adjacent to that regular channel.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
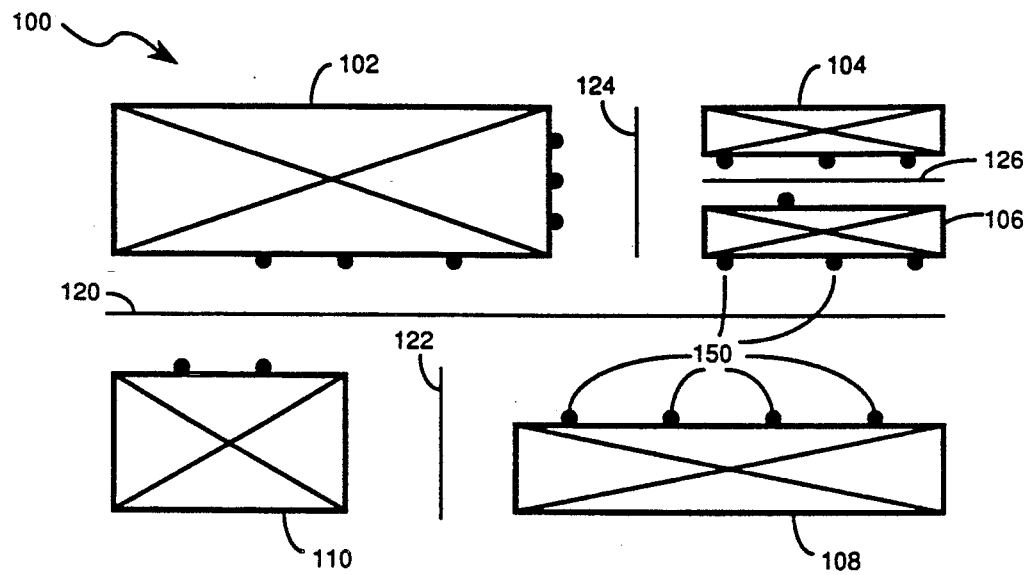
FIG. 1 schematically depicts the layout of an integrated circuit.

To fully understand the present invention, it is first necessary to understand the meaning of the terms "sliceability", "slice", "channel", and "switch box" as those terms are used by the designers of computer aided design systems which perform automated routing of the interconnections between the components in an integrated circuit layout.

The state of the art prior to the present invention is represented by the following articles David Hsu et al., "The ChipCompiler, An Automated Standard Cell/Macrocell Physical Design Tool", Proc. Custom Integrated Circuits Conference 1987, pp.488-491. Sieji Kimura, Noboru Kubo, Toru Chiba and Ikuo Nishioka, "An Automatic Routing Scheme for General Cell LSI," IEEE Transactions on CAD, pp.285-292, October 1983. Wei-Ming Dai, Tetsuo Asano and Ernest S. Kuh, "Routing Region Definition and Ordering Scheme for Building-Block Layout," IEEE Transactions on CAD, vol CAD-4, no. 3, pp.189-197, July 1985. Charles H. Ng, "A Gridless Variable-Width Channel Router for Macro Cell Design, Proc. 24th Design Automation Conference, 1987. These articles are hereby incorporated by reference.

DEFINITIONS

For the purposes of this discussion, a "circuit component" is defined to be a rectangular area incorporating the layout of an integrated circuit which has a number of connection terminals at predefined locations along the outside of the rectangular area. Thus, even if the layout of the circuit is not rectangular, for the purposes of automatic routing, a rectangular region which completely covers the circuit is formed and terminals along the outside of that rectangle are specified.

A "circuit region" is defined herein to mean a circuit layout or a portion of a circuit layout, which includes one or many circuit components as well as zero or more routing regions.

A "netlist" is a set of information, typically in the form a data structure stored in a computer, which denotes all the connections between the terminals of the circuit components in a specified circuit. For instance, a netlist may take the following form:

| C1,T1 | C2,T4 | |
| C1,T2 | C2,T3 | C7,T1 |
| C1,T3 | C4,T5 | |
| C1,T4 | C2,T2 | C3,T4 |
| ... | | | where Ci,Tj denotes terminal j of circuit component i and each line or record in the netlist denotes the set of terminals coupled to each node in the circuit and therefore denotes the a set of terminals that are to be connected.

"Slicing the layout of a circuit region" means dividing a circuit region into two portions with a single straight line. In most embodiments, each line used to "slice" a circuit must be either horizontal or vertical.

"Routing" a channel means forming a set of interconnections coupled to each of the fixed terminals along the edges of the channel. Given a specified circuit layout with specified terminals that are to be interconnected, there are well known techniques for routing the interconnections through any given channel in that circuit layout. Since these routing techniques are well known to those skilled in the art, those techniques are not described herein. The present invention concerns only a system and method for properly defining the channels through which interconnections will be routed, and the order in which those channels should be routed. After the channels in the circuit are defined in accordance with the present invention, standard prior art routing techniques are used to form the actual interconnections between the terminals in the specified circuit layout.

SLICEABILITY

Referring to FIG. 1, there is shown the layout of a relatively simple, sliceable circuit 100. The circuit 100 has a number of circuit components 102, 104, 106, 108 and 110. The spaces between the circuit components are routing regions, which are herein called channels for reasons that will be explained below. The circuit (i.e., circuit layout) 100 has an important characteristic which is known as "sliceability". A sliceable circuit is one which can be sliced (i.e., divided) into two portions by a straight horizontal or vertical line, and for which every circuit region having more than one component that was created by a previous slice, can be again sliced by a straight horizontal or vertical line, until the circuit has been completely divided into rectangular circuit regions each containing a single circuit component. In FIG. 1, the sequence of slices is 120, 122, 124, 126.

In accordance with the prior art, a channel is defined for each slice by forming the largest rectangular routing region incorporating the slice, and then appending certain neighboring rectangular regions, as will be explain in more detail below. Channels 130, 132, 134 and 136 correspond to slices 120, 122, 124, and 126, respectively. Note that channel 130 includes the area of region 138. As exemplified by channel 130, channels in general have a rectilinear shape, and are not limited to rectangular shapes. In the present invention, however, channels are limited to rectangular shapes and region 138 will be treated as a separate "additional routing region", also herein called a "special channel", as will be explained below.

Each channel is usually bounded on two parallel sides, which are parallel to a slice, by circuit components. The channel is bounded on its other two sides by either the boundaries of the circuit or previously defined channels (i.e., the channels associated with earlier formed slices). If there are any remaining routing regions not enclosed by the channels formed using this method, such as region 138 in FIG. 2, those regions are herein called additional routing regions Additional routing regions, i.e., special channels, are usually bounded on only one side by circuit components, and are bounded on the other three sides by other channels or the boundaries of the circuit.

Certain routing regions, such as region 138 in FIG. 1 are a considered to be problem for automatic routing systems. To understand why this is so, we must first discuss how interconnections are routed.

The circuit components in FIG. 1 have a number of labelled terminals (also herein called connection points) 150 found along the borders of the circuit components. The location of each such terminal is defined by the definition of the circuit component. When generating the interconnection between two terminals, such as terminals 150-1 and 150-2, the connection is routed in a sequence of steps. Generally, when an interconnection line is routed through a rectangular routing region, a route is generated which is a sequence of one to three linear interconnection segments. Each interconnection segment must be either vertical or horizontal, and must be connected at each end to either a terminal or to another interconnection segment. Furthermore, no two line segments can overlap each other, although the interconnection segments of distinct interconnections can cross over or under one another because the vertical and horizontal interconnection segments are formed on different layers of the semiconductor circuit. Thus the "no overlap" restriction means that two parallel interconnection segments cannot overlap. See for example interconnections 160 and 162 in FIG. 2.

Figure 3:
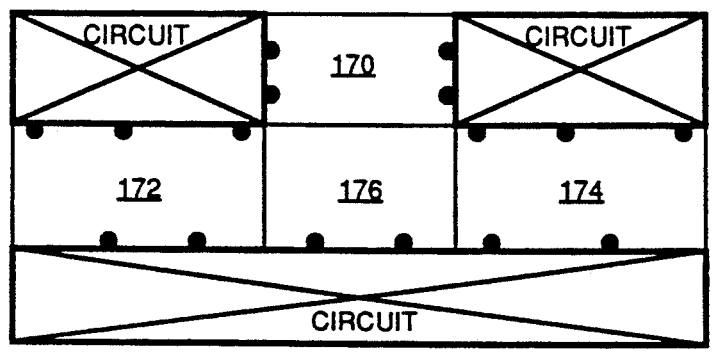
FIG. 3 depicts an integrated circuit layout having routing regions which include three channels and a switch box.
Figure 4:
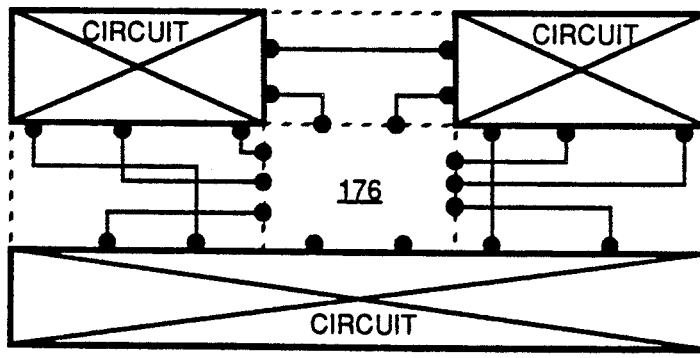
FIG. 4 depicts another integrated circuit and some segments of the interconnection lines connecting the terminals of the circuit's components.

A channel is usually defined as a rectilinear routing region which has fixed terminals or connection points on only two opposite sides. A switch box is a routing region which has fixed terminals on either all four sides, or on at least two non-opposing sides. Referring to FIG. 3, regions 170, 172 and 174 are channels and region 176 is a switch box, if these routing regions there are routed in the following order: 170, 172, 174, and then 176. As each of the channel regions 170, 172 and 174 is routed, terminals are defined on only two sides before interconnections are routed through these regions. As shown in FIG. 4, after regions 170, 172 and 174 have been, region 176, will have terminals on all four sides.

It should be understood that when the interconnections for a circuit are routed, routing is performed on one routing region at a time, with all the interconnection routes through one routing region being generated before proceeding to the next routing region. As will be explained below, for sliceable circuits, the best order in which the routing regions are to be routed is well defined. The determination as to whether a particular selected routing region is a channel or a switch box depends on which regions have been routed before the selected region is routed. If the selected routing region is bounded on only one side or on two opposing sides by circuit components and previously routed regions, and does not touch any previously routed regions on its other sides, then the selected routing region is a channel. Otherwise it is a switch box.

In general, it is well known to those skilled in the art that channel routing (i.e., routing interconnections through channels) is much easier than switch box routing. The method of routing interconnections through channels is much simpler than the known methods for routing interconnections through switch boxes. Also, for channel routing, the best order in which to route interconnections through a sequence of channels is well defined. For switch box routing, there is no well defined best order for routing, and it is often necessary to delete previously selected routing interconnections and to then reroute those interconnections. For this reason, switch box routing is avoided whenever channel routing is possible. Since all sliceable circuits can be completely routed using channel routing, requiring that all circuit layouts be sliceable eliminates the need for switch box routing.

Figure 5:
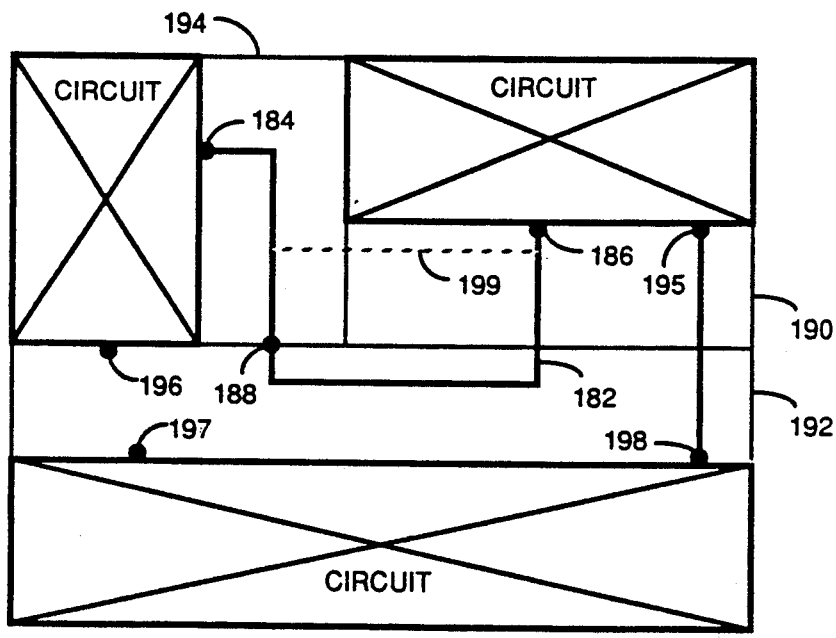
FIG. 5 depicts an integrated circuit layout including a connection line between the terminals of two circuit components.

Referring to circuit layout 180 in FIG. 5, consider connection line 182 which is the connection generated by most prior art systems for interconnecting terminals 184 and 186. The problem with connection line 182 is that it is much longer than necessary. To understand this problem, we first need to explain how connection line 182 is formed by a prior art routing system. In the prior art, routing region 190 is typically considered to be part of region 192, with the combined region 190-192 being considered to be a channel with fixed terminals only on the horizontal boundaries of this region 190-192. In this example, first region 194 will be routed, creating terminal 188 on the border of region 194. Then region 190-192 will be routed. The region 190-192 is a channel because it has fixed terminals 186, 188, 195, 196, 197 and 198 only on two opposing sides of the region. The resulting interconnection between terminals 184 and 186 is connection line 182.

Clearly, connection line 182 is much longer than necessary. If connection segment 199 were used, the connection line would be about half as long. The reason that connection segment 199 can't be used when using the prior art routing techniques is as follows. In order to retain the benefits of channel routing, when region 190-192 is routed, it can have predefined terminals only on two opposing sides. This means that region 190 cannot have a terminal on any of its vertical boundaries. Since region 194 must be routed before region 190-192, when region 194 is routed the connection terminal from terminal 184 must join region 190-192 on a horizontal boundary of region 190-192. This results in the generation of line 182.

Generally, the way that channel regions are defined in the prior art is as follows. After making a slice, the channel is initially defined as the largest possible rectangular routing region which incorporates the slice. Then the routing system appends to the channel any neighboring rectangular routing regions which have fixed terminals only on the same sides (i.e., either the horizontal sides or the vertical sides) as the channel. In FIG. 5, this means that when the circuit 180 is first sliced, the corresponding channel is initially defined as region 192. Then, since region 190 has fixed terminals only on one horizontal side, it is added to the channel, forming a single channel 190-192.

The present invention is based on the discovery by the inventors of a better way of defining channels than the above described prior art method.

DEFINING ROUTING REGIONS AND ORDER OF ROUTING

When routing the interconnections in a sliceable circuit the order of routing is determined by the following sequence of steps.

STEP 0: Initially, the circuit has only one unsliced region, comprising the entire circuit.

STEP 1: Make a first slice through the circuit, dividing the circuit into two circuit regions. Define a routing region for that slice, and define that routing region as the root node of a routing tree (see FIG. 6 and the discussion of routing trees below).

STEP 2: Slice any unsliced circuit region of the circuit into two circuit regions.

STEP 3: Define a channel (routing region) for the slice made in step 2 and add it to the routing tree. Add this channel to the tree so that the parent element in the tree corresponds to the slice which formed the circuit region sliced in step 2.

STEP 4: Repeat steps 2 and 3 until there are no remaining unsliced circuit regions of the circuit containing more than one circuit component.

STEP 5: Then, route one channel at a time in any sequence, so long as each channel is routed only after all other channels denoted by nodes in the routing tree which branch from that channel's node have been routed (i.e., channels are routed starting at the outer branches of the tree).

It should be noted that instead of using a routing tree, one can simply maintain a ordered list of the channels, ordered in the same order that the channel regions are defined by the above sequence of steps. Then, interconnections are routed through the channels in the reverse order from that in the list.

As will be described below, the present invention alters the above sequence of steps somewhat, and also alters the structure of the routing tree.

ROUTING TREE

Figure 6:
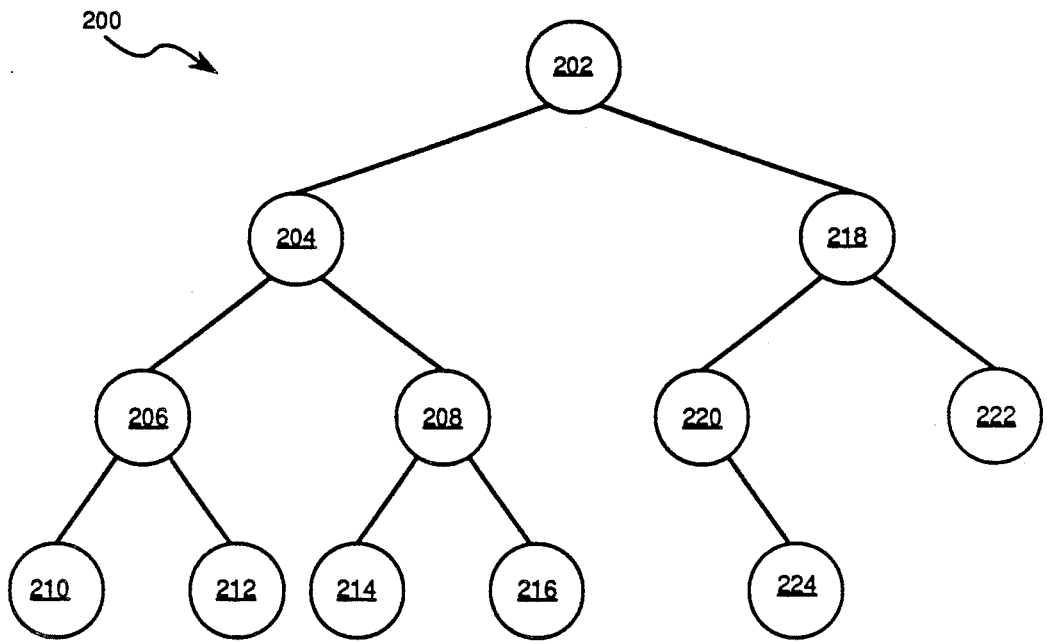
FIG. 6 depicts a data structure or a routing tree representing the routing regions between circuit components in an integrated circuit layout.

Referring to FIG. 6, there is shown a routing tree 200 which uses a conventional tree data structure having a set of nodes coupled to one another by branches. Each node represents one channel in a circuit layout and also indirectly represents the slice which generated that channel. Each node (except the root node) has a "parent" node which is one step closer to the root node 202 of the tree 200. For example, the parent of node 208 is node 204.

More importantly, the parent of a node corresponds to the slice which created the circuit region in which the channel represented by the node is located. Thus, each branch couples a node, corresponding to a first channel, to a second node corresponding to a channel in one of the two circuit regions divided from one another by the first channel.

In terms of the prior art method of defining the routing channels in a sliceable circuit, the root node 202 corresponds to first slice made through the circuit layout. More specifically, root node 202 is used to define the area occupied by the channel. For instance, the root node 202 may contain data denoting all of the corners of the channel, traversing the outside of the channel in a clockwise direction.

After making the first slice and forming the first channel, the circuit being worked on will contain two circuit regions, one on either side of the slice, that are candidates for slicing. Assuming that we are working on a large circuit with many components, each of these circuit regions will probably contain a plurality of circuit components. Nodes 204 and 218 represent the two channels formed when each of these two circuit regions are sliced. Each of these two slices will generate further circuit regions that will be candidates for slicing. Eventually all the routing regions between circuit components will be represented by nodes in the routing tree 200.

Figure 7:
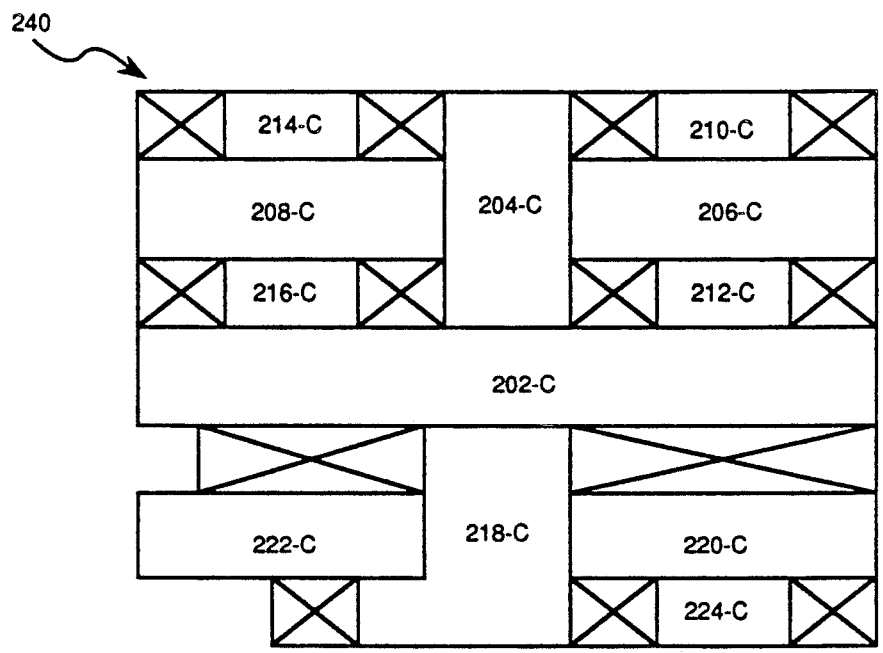
FIG. 7 schematically depicts a circuit layout corresponding to the routing tree shown in FIG. 6.

FIG. 7 schematically depicts a circuit layout 240 with channels 204-C through 224-C corresponding to the nodes in tree 200.

SPECIAL CHANNELS

Referring to FIG. 5, in the prior art, region 190 is added to region 192 to form a channel 190-192 because this combined routing region still qualifies as a channel in that the combined region has fixed terminals only two opposing sides. Region 190 cannot be added to region 194 because the resulting combined region would have fixed terminals on two sides that are not opposing—which means that the resulting combined region would have to be treated as a switch box. As mentioned above, routing interconnections through switch boxes is to be avoided whenever it is possible to use channels.

The present invention rejects the prior art treatment of routing regions such as region 190 because it results in interconnections which are too long. Instead, in accordance with the present invention, region 190 will be treated as a "special channel" that is routed before region 194. The resulting order of routing is therefore 190, 194 and then 192. Using this order of routing, each region qualifies as a channel. Furthermore, the connection between terminals 184 and 186 will follow line segment 199, resulting in the shortest possible interconnection between these two terminals.

Figure 2:
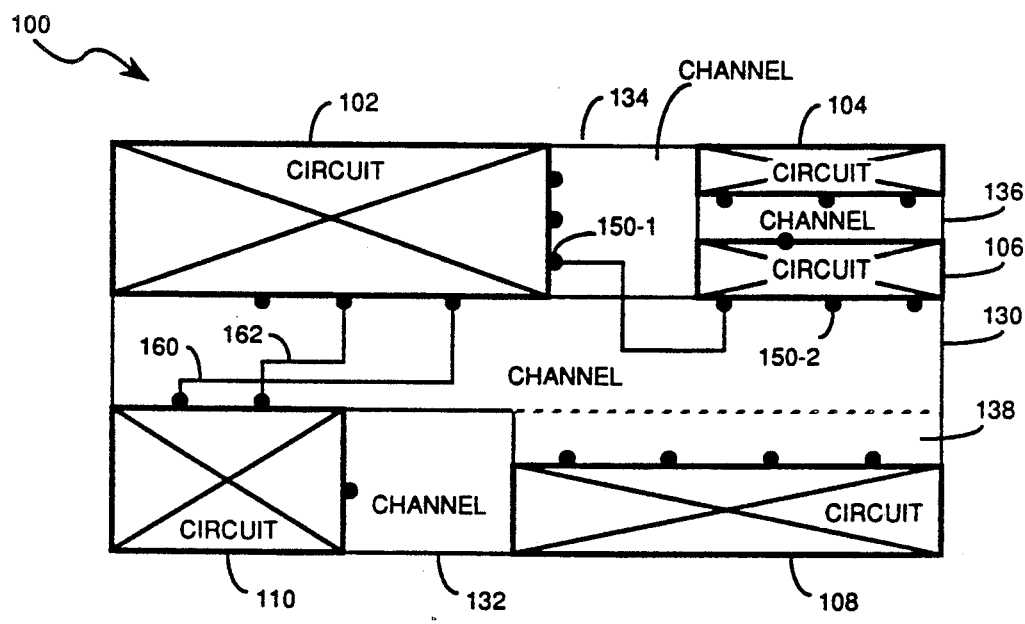
FIG. 2 depicts the layout of an integrated circuit and the routing regions between the circuit's components.

The method for identifying special channels and for determining the order of routing is as follows. After each slice, a corresponding channel is defined as the largest (or widest) possible rectangle which surrounds the slice. Referring to FIGS. 1 and 2, region 130 is the largest possible rectangle which surrounds slice 120. Similarly, region 132 is the channel corresponding to slice 122. Note, that in the preferred embodiment, all channels are rectangular in shape, unlike the prior art which allows rectilinear channel shapes.

Next, we determine if there any "indentations" on either side of the channel. An indentation is herein defined to mean a rectangular routing region neighboring the channel which (1) is at one of the two ends of the slice being processed, and (2) extends the full length of its circuit region in the direction perpendicular to the slice. In FIG. 2, region 138 is an indentation corresponding to channel 132 and slice 122 because it (1) is at one end of the circuit region on the circuit region 108-130 on the right side of channel 132, and (2) because it extends the full length of that circuit region. Each indentation is herein called a special channel, which will be routed before its corresponding regular channel. Thus special channel 138 will be routed before channel 132.

Figure 8:
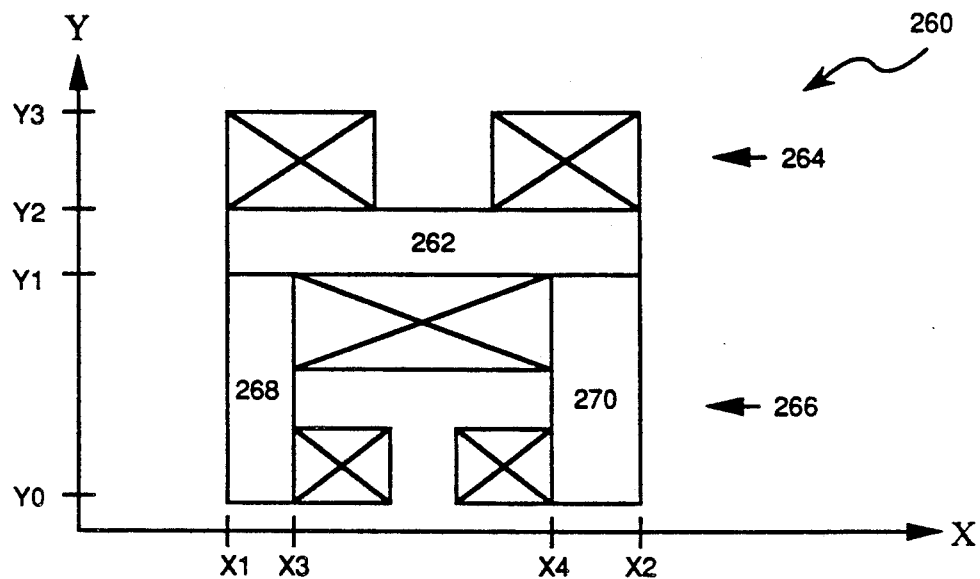
FIG. 8 shows a simple circuit layout for a channel having two corresponding special channels.
Figure 9:
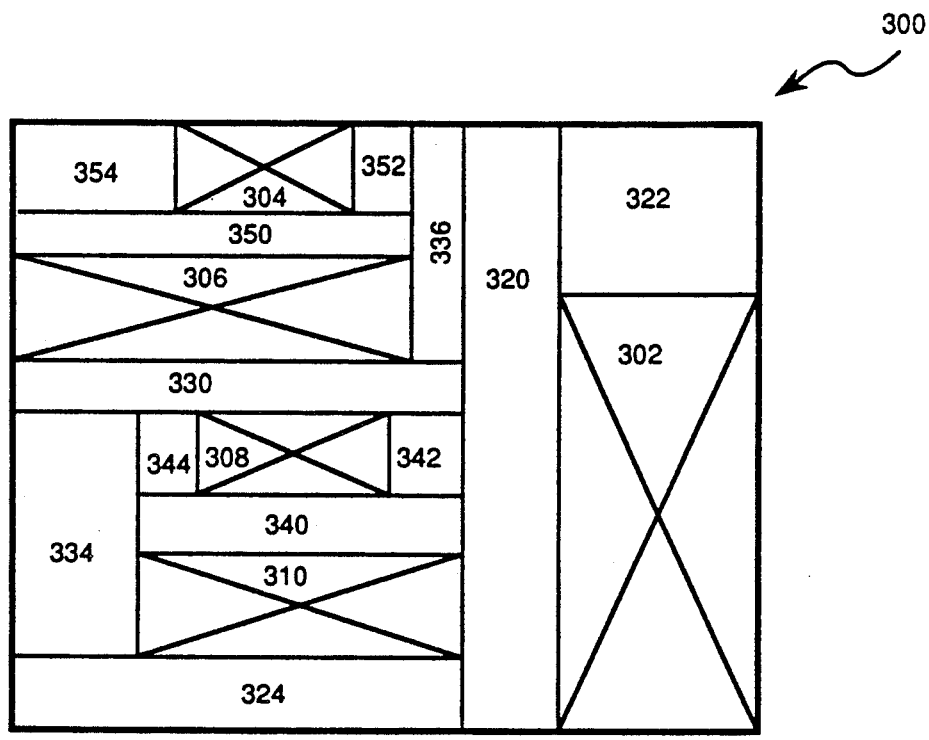
FIG. 9 shows a somewhat more complicated circuit having four regular channels each of which has at least one corresponding special channel.

Referring to FIG. 8, there is shown a simple circuit layout 260 that will be used to explain the step by step method for identifying special channels. In FIGS. 8 and 9, circuit components are represented by boxes with two diagonal lines crisscrossing from corner to corner. After making each slice and forming the corresponding channel, there will be a circuit region on either side of the channel. Each of these circuit regions is then analyzed to determine if it contains an indentation. For example, assume that the slice was parallel to the x-axis, and that the corresponding channel 262 is defined by the coordinates of its lower left and upper right corners: (X1,Y1) and (X2,Y2). The two circuit regions 264 and 266 on either side of the channel occupy rectangles, circuit region 264 being defined by (X1,Y2), (X2,Y3) and circuit region 266 being defined by (X1,Y0), (X2,Y1).

The ends of the slice are identified by its minimum and maximum x coordinates of the slice, denoted here as X1 and X2. The routing system then determines the minimum and maximum x coordinates of the circuit components in each of the circuit regions, such as X3 and X4 for circuit region 266. If X3 is not equal to X1, then there is an indentation on the left side of circuit region 266, and if X4 is not equal to X2 then there is an indentation on the right side of the circuit region 266. The upper and lower x and y boundaries of the first indentation are X1, X3, Y0, Y1, and for the second indentation are X4, X2, Y0, Y1. These sets of coordinates define the boundaries of two special channels 268 and 270.

As shown, the upper circuit region 264 in FIG. 8 does not have any indentations. In general, each slice will generate one regular rectangular channel and as many as two special channels.

FIG. 9 shows a somewhat more complicated circuit layout 300. This sliceable circuit layout 300 has five circuit components 302-310 and thus it will take four slices to define the channels and special channels. The first slice will generate channel 320 and two special channels 322 and 324. The second, third and fourth slices could proceed in any order. Assuming that the second slice generates channel 330, that slice will also generate two special channels 334 and 336. The third slice generates channel 340 and two special channels 342 and 344. Finally, the fourth slice generates channel 350 and special channels 352 and 354.

As will be understood by those skilled in the art, when routing a circuit having output pads, the set of output pads on each edge of the circuit is treated as a single circuit component with a set of specified connection terminals. There is generally a rectangular routing region between the output pads and the circuit internal which is treated as a regular channel.

ROUTING WITH SPECIAL CHANNELS

In accordance with the present invention, before routing interconnections through a regular channel, the CAD system will first route interconnections through the corresponding special channel, if any. Regular channels are routed in the same order as in the prior art: either in the opposite order from which the channels were defined during the circuit slicing process, or, when representing the channels by a routing tree, by always processing the channels at the bottom of each tree branch before processing the parent channels.

In the present invention, the data structure of the nodes in the routing tree (such as the tree shown in FIG. 6) for a circuit layout is different than the one used for the prior art. In the prior art, each nodes represents the nodes of one rectilinear channel. In the present invention, each node represents one regular rectangular channel and its corresponding special channels.

Figure 10:
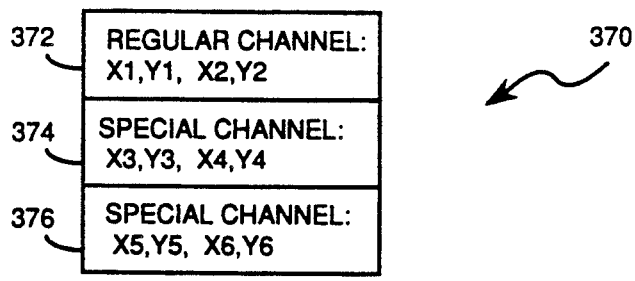
FIG. 10 depicts the data structure of one node in the tree shown in FIG. 6.

FIG. 10 shows the data structure 370 for one node in the routing tree, as those nodes are used in the present invention. As shown in FIG. 10, each node has a first entry 372 for denoting the x and y boundaries the regular channel corresponding to that node, and also entries 374 and 376 for denoting the x and y boundaries of up to two special channels adjacent to the regular channel.

Figure 11:
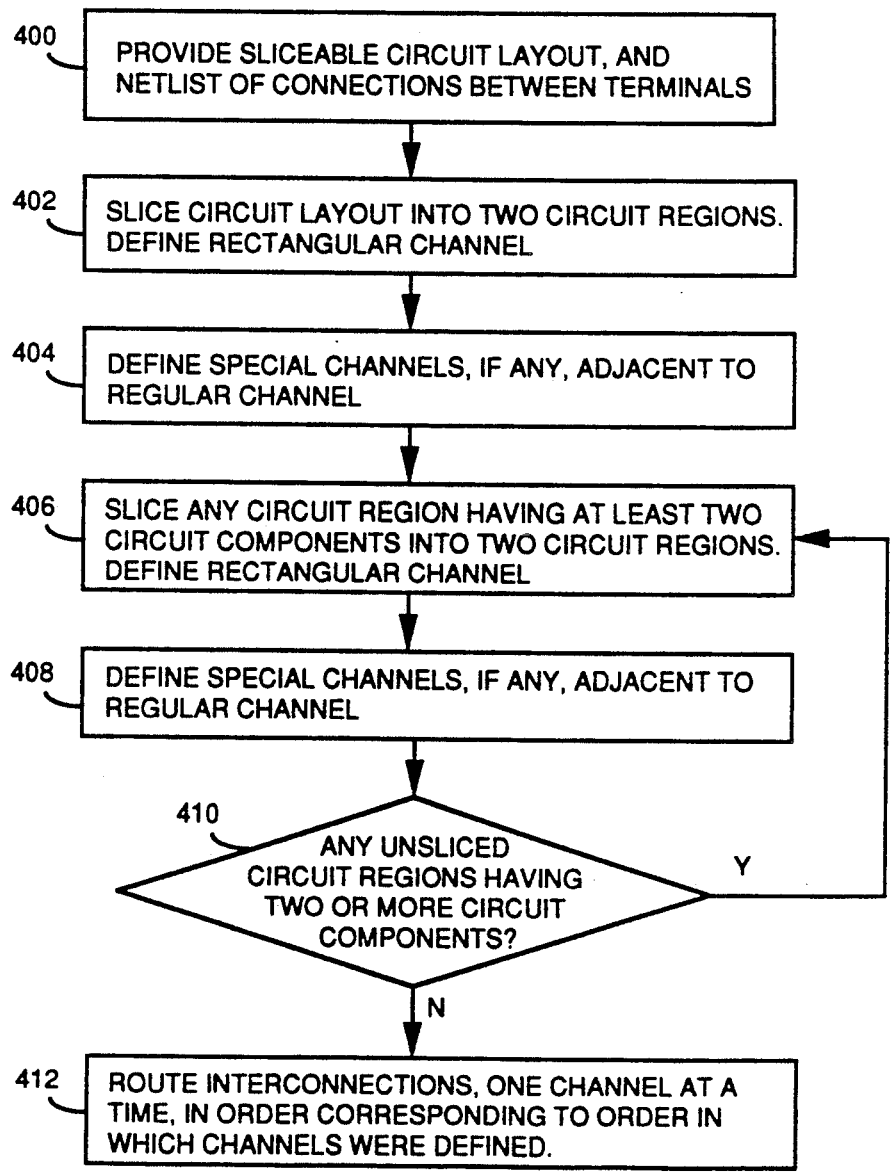
FIG. 11 is a flow chart of the method of the present invention.

Referring to the flow chart in FIG. 11, when using the present invention the steps of the method of routing interconnections between specified terminals in a specified circuit layout are as follows:

STEP 0: Initially, the circuit layout has only one unsliced region, comprising the entire circuit. The CAD system is provided with a representation of the circuit layout and a netlist which specifies the terminals in the circuit layout that are to be connected together (box 400).

STEP 1: Make a first slice through the circuit, dividing the circuit into two circuit regions. Define a rectangular channel for that slice, and define that channel as the root node of a routing tree (see FIG. 6) (box 402 in FIG. 11).

STEP 1A: Check to see if there are any indentations adjacent to the channel. If so, define a special channel for each such indentation, and add the special channels to the data stored in the root node of the routing tree (box 404).

STEP 2: Slice any unsliced circuit region of the circuit into two circuit regions (box 406).

STEP 3: Define a rectangular channel for the slice made in step 2 (box 406). Add a node denoting this channel to the routing tree, with the node being positioned in the routing tree so that its parent corresponds to the slice which formed the region sliced in step 2.

STEP 3A: Check to see if there are any indentations adjacent to the channel. If so, define a special channel for each such indentation, and add the special channels to the data stored in the node generated by step 3 (box 408).

STEP 4: Repeat steps 2, 3 and 3A until there are no remaining unsliced regions of the circuit containing more than one circuit component (box 410).

STEP 5: Then, route interconnections through the circuit layout, one channel at a time, in any sequence, so long as each channel is routed only after all other channels denoted by nodes in the routing tree which branch from that channel's node have been routed (box 412). Before routing each channel, route the special channels corresponding to the channel (i.e., special channel denoted by the same node in the routing tree), if any.

As before, it is noted that instead of using a routing tree, one can simply maintain a ordered list of the channels, ordered in the same order that the channel regions are defined by the above sequence of steps, and then route the channels in the opposite order from which they were added to the list. As when using the routing tree method, the special channels for each regular channel are routed before the corresponding regular channel is routed.

More generally, the results of the channel definition process must be denoted in a data structure denoting the sequence in which the channels are defined, the region of the layout occupied by each channel, and for each channel, the region of the layout occupied by each corresponding special channel, if any.

Figure 12:
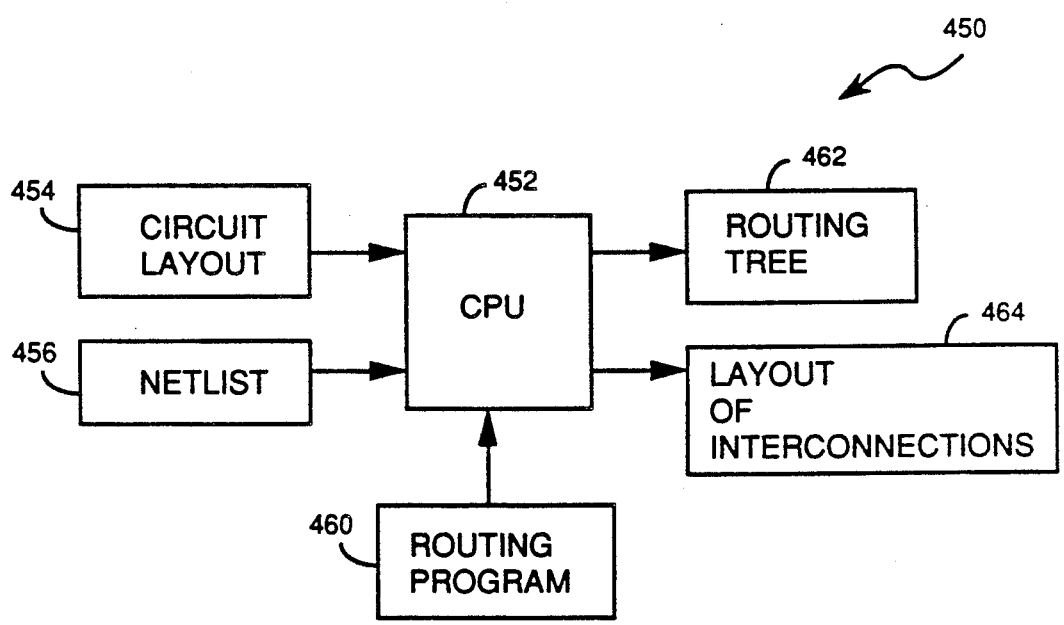
FIG. 12 is a block diagram of a system incorporating the present invention.

FIG. 12 is a block diagram of a CAD system 450 incorporating the present invention. As shown, the system comprises a computer or CPU 452 which accepts inputs comprising a circuit layout specification 454, which defines the layout of the circuit to be routed and the locations of the terminals in the circuit, and a netlist 456, which specifies the terminals in the circuit that are to be interconnected. A routing program 460 controls the process by which the computer 452 analyzes the circuit layout 454 and netlist 456, and generates first a routing tree 462 representing all the channels and special channels in the circuit layout, and then a description of the layout of the interconnects between terminals 464 as specified in the netlist.

ALTERNATE EMBODIMENTS

The present invention could be used in a number of types of computer aided design systems having components requiring electrical interconnection, not just in cell based and gate-array design systems. For instance, the present invention could be used to facilitate the automatic generation of interconnects for a totally or partially customized integrated circuit. It could also be used for designing the interconnections on a printed circuit board.

The present invention can also be used with circuits that are not sliceable, in that the methodology of the present invention can be used to define special channels adjacent to each regular, rectangular channel. The use of special channels in such a circuit will facilitate the generation of short interconnections, but will not help to overcome any of the problems associated with switch box routing.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of routing interconnections through the layout of a circuit, the steps of the method comprising:
   (a) providing a circuit layout specification including a specification of the regions of the layout occupied by circuit components, a specification of the locations of terminals in said layout, and a netlist specifying for each said terminal the set of other ones of said terminals that are to be connected to said terminal; the regions of said circuit layout not occupied by circuit components comprising routing regions;

(b) sequentially defining a series of rectangular channels, each of which divides a region of said circuit layout containing two or more circuit components into two smaller circuit regions adjacent said rectangular channel, each of said two smaller circuit regions having at least one circuit component;

(c) for each said channel, determining for each of its two adjacent circuit regions whether there is a rectangular indentation adjacent said channel which is adjacent one side and one corner of said channel and which extends the full length of said adjacent circuit region in a direction perpendicular to said one side of said channel, and then defining a rectangular special channel for each indentation adjacent said channel, if any; and (d) then routing interconnections through said channels and special channels; said routing step for each said channel including the step of routing interconnections through said special channels, if any, corresponding to said channel before routing interconnections through said channel.

2. The method of routing interconnections set forth in claim 1, including the steps of defining a data structure denoting the sequence in which said channels are defined, the region of said layout occupied by each said channel, and for each said channel, the region of said layout occupied by each corresponding special channel, if any;

said routing step including the step of routing interconnections through said channels, in an order corresponding to the sequence in which said channels were defined.

3. The method of routing interconnections set forth in claim 2, wherein said data structure comprises a routing tree having a multiplicity of nodes coupled to one another by branches, each node of said routing tree denoting the regions of said layout occupied by one said channel and its corresponding special channels, if any; each said branch coupling a first node corresponding to a first one of said channels to a second node corresponding to a channel in one of said two circuit regions divided by said first one of said channels; said routing tree including a root node denoting the first channel defined in step (b) and its corresponding special channels defined in step (c);

said routing step including the step of routing interconnections through said channels in an order such that each channel is routed after all other channels denoted by nodes in said routing tree which branch from said channel have been routed.

4. The method of routing interconnections through the layout of an integrated circuit, the steps of the method comprising:

(a) providing a sliceable circuit layout specification including a specification of the regions of the layout occupied by circuit components, a specification of the locations of terminals in said layout, and a netlist specifying for each said terminal the set of other ones of said terminals that are to be connected to said terminal; the regions of said circuit layout not occupied by circuit components comprising routing regions;

(b) selecting a first slice through said circuit layout and thereby dividing said circuit layout into two circuit regions;

(c) defining a first rectangular channel corresponding to said first slice;

(d) determining for each of said two circuit regions whether there is a rectangular indentation adjacent said first channel which is adjacent one side and one corner of said channel and which extends the full length of said circuit region in a direction perpendicular to said one side of said first channel, and then defining a rectangular special channel for each indentation adjacent said first channel, if any;

(e) for each said circuit region containing at least two circuit components, performing the steps of:

(e1) selecting a slice through said circuit region and thereby dividing said circuit region into two smaller circuit regions;

(e2) defining a rectangular channel corresponding to said slice; and (e3) determining for each of said two smaller circuit regions whether there is a rectangular indentation adjacent said channel which is adjacent one side and one corner of said channel and which extends the full length of said smaller circuit region in a direction perpendicular to said one side of said channel, and then defining a rectangular special channel for each indentation adjacent said channel, if any;

(f) repeating said steps e1, e2 and e3 until all the circuit regions have been divided into circuit regions contain only one circuit component; and (g) then routing interconnections through said channels, in an order corresponding to the order in which said channels were defined by said channel defining steps; said routing step for each said channel including the step of routing interconnections through said special channels, if any, corresponding to said channel before routing interconnections through said channel.

5. The method of routing interconnections set forth in claim 4, including the steps of defining a routing tree having a root node denoting first channel and said corresponding special channels, if any;

defining a new node on said routing tree for each slice selected by step e1, said node denoting said channel defined by step e2 and said corresponding special channels defined by step e3, if any; the parent node of each said new node being a previously defined node of said routing tree corresponding to the slice which created the circuit region in which said channel for said new node is located.

6. A computer aided design system for designing interconnections between components in the layout of a circuit, comprising:

means for providing a circuit layer specification including a specification of the regions of the layout occupied by circuit components, a specification of the locations of terminals in said layout, and a netlist specifying for each said terminal the set of the other ones of said terminals that are to be connected to said terminal; the regions of said circuit layout not occupied by circuit components comprising routing regions;

channel defining means for sequentially defining a series of rectangular channels, each of which divides a region of said circuit layout containing two or more circuit components into two smaller circuit regions each having at least one circuit component;

said channel defining means including special channel defining means for determining for each of said two smaller circuit regions whether there is a rectangular indentation adjacent said channel which is adjacent one side and one corner of said channel and which extends the full length of said smaller circuit region in a direction perpendicular to said one side of said channel, and then defining, for each said channel, a rectangular special channel for each indentation adjacent said channel, if any; and routing means for routing interconnections through said channels and special channels; said routing means including means for routing interconnections through said special channels, if any, corresponding to a channel before routing interconnections through said channel.

7. The computer aided design system set forth in claim 6, said channel routing means including means for defining a data structure denoting the sequence in which said channels are defined, the region of said layout occupied by each said channel, and for each said channel, the region of said layout occupied by each corresponding special channel, if any;

said routing means including means for routing interconnections through said channels, in an order corresponding to the sequence in which said channels were defined as denoted in said data structure.

8. The computer aided design system set forth in claim 7, wherein said data structure comprises a routing tree having a multiplicity of nodes coupled to one another by branches, each node of said routing tree denoting the regions of said layout occupied by one said channel and its corresponding special channels, if any; each said branch coupling a first node corresponding to a first one of said channels to a second node corresponding to a channel in one of said two circuit regions divided by said first one of said channels; said routing tree including a root node denoting the first channel defined by said channel means and its corresponding special channels defined by said special channel means;

said routing means including means for routing interconnections through said channels in an order such that each channel is routed after all other channels denoted by nodes in said routing tree which branch from said channel have been routed.

* * * * *